(12) United States Patent
Muller et al.

(10) Patent No.: US 7,659,154 B2
(45) Date of Patent: Feb. 9, 2010

(54) DUAL GATE CMOS FABRICATION

(75) Inventors: Markus Muller, Grenoble (FR); Peter Stolk, Bernin (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/573,346

(22) PCT Filed: Aug. 1, 2005

(86) PCT No.: PCT/IB2005/052569

§ 371 (c)(1),
(2), (4) Date: Jan. 30, 2008

(87) PCT Pub. No.: WO2006/018762

PCT Pub. Date: Feb. 23, 2006

(65) Prior Publication Data

US 2008/0169511 A1 Jul. 17, 2008

(30) Foreign Application Priority Data

Aug. 13, 2004 (EP) ................................. 04300538

(51) Int. Cl.
*H01L 21/28* (2006.01)
*H01L 21/44* (2006.01)
(52) U.S. Cl. ..................... 438/176; 438/573; 438/588; 438/660; 257/E21.156
(58) Field of Classification Search ......... 438/587–588, 438/605, 622, 663–664, 176, 573, 660; 257/E21.156
See application file for complete search history.

(56) References Cited

U.S. PATENT DOCUMENTS

| 6,255,204 | B1 * | 7/2001 | Tobin et al. | 438/592 |
| 6,518,154 | B1 | 2/2003 | Buynoski et al. | |
| 7,316,950 | B2 * | 1/2008 | Park et al. | 438/199 |
| 7,528,024 | B2 * | 5/2009 | Colombo et al. | 438/176 |
| 2004/0245578 | A1 * | 12/2004 | Park et al. | 257/369 |
| 2005/0258468 | A1 * | 11/2005 | Colombo et al. | 257/314 |
| 2006/0128125 | A1 * | 6/2006 | Mangelinck et al. | 438/483 |

FOREIGN PATENT DOCUMENTS

WO    WO 2004095572 A1 * 11/2004

* cited by examiner

*Primary Examiner*—David Vu
*Assistant Examiner*—Earl N Taylor

(57) ABSTRACT

The invention relates to a method of fabricating a CMOS device, comprising providing a semiconductor substrate (101) having therein a layer of insulating material (102), the method comprising providing a layer (106) of a first material over the insulating layer (102), the thickness of the layer (106) of the first material being less in a first region (103) for supporting a first active device than in a second region (104) for supporting a second active device. A layer (107) of a second material is then deposited over the layer (106) of a first material, and the structure is then subjected to a thermal treatment to alloy the first and second materials. The portion of the layers over the first region is entirely alloyed, whereas the portion of the layers over the second region is not, so that a portion (109) of the layer (106) of the first material remains.

10 Claims, 4 Drawing Sheets

DUAL GATE CMOS FABRICATION

FIELD OF THE INVENTION

This invention relates generally to a method of fabricating a semiconductor device including a plurality of active device regions each having a gate electrode, for example, a CMOS device comprised of one or more of each of NMOS and PMOS transistors.

BACKGROUND OF THE INVENTION

Conventional Metal-Oxide-Semiconductor Field-Effect Transistors (MOSFETs) utilize poly-silicon for forming gate electrodes, in view of its good thermal stability, i.e. its ability to withstand high temperature processing. More specifically, the good thermal stability of poly-silicon-based materials permits high temperature annealing thereof during formation/activation of implanted source and drain regions. In addition, poly-silicon-based materials advantageously block implantation of dopant ions into the underlying channel region of the transistor, thereby facilitating formation of self-aligned source and drain regions after gate electrode deposition and patterning are completed.

However, poly-silicon-based gate electrodes have a number of problems associated therewith, as a result of which, CMOS structures have been proposed in which two different materials are used as the gate materials for respective NMOS and PMOS devices, and suitable integration techniques are therefore required.

There are currently two such integration techniques proposed. A first technique, known as a dual metal gate process, consists of deposition of a first electrode material A with work function $\phi_A$ on both NMOS and PMOS devices, its complete removal on one transistor type, and then uniform deposition of a second gate electrode material B with work function $\phi_B$, followed by the final gate patterning process. However, a major difficulty arises in this technique, in respect of the complete removal of the first gate electrode material without damaging the gate oxide.

A second technique is described in U.S. Pat. No. 6,518,154, in which a process is described for fabricating a semiconductor device including a plurality of active devices, such as NMOS and PMOS transistors, formed on a common semiconductor substrate. In the described process, a first blanket layer of a first metal is deposited over a gate insulator layer provided on the substrate, then a masking layer segment is laid over the layer of metal in the region of the first active device and a second blanket layer of a second metal or semi-metal is deposited over the upper surface of the resultant structure covering the masked and unmasked upper surface thereof. The structure is then subjected to a thermal treatment at an elevated temperature in an inert atmosphere for effecting an alloying or silicidation reaction between the first and second blanket layers where they are in contact (i.e. in the region of the second active device), whereas the masking segment prevents such alloying or silicidation in the region of the first device. The second blanket layer and masking segment are then removed from the region of the first active device, leaving a first gate electrode layer of the first material in the region of the first device and a second gate electrode layer of the alloyed first and second materials in the region of the second active device. Finally, the gate electrode layers are patterned.

SUMMARY OF THE INVENTION

It is an object of the present invention to provide a dual gate process for fabricating a semiconductor device having a plurality of active devices of at least two different types, wherein no masking layer is required for providing the gate electrode layers in two adjacent active device regions. It is also an object of the invention to provide an integrated circuit including a semiconductor device fabricated according to such a process.

In accordance with the present invention, there is provided a method of fabricating a semiconductor device comprising first and seconds active devices provided in first and second respective regions of a semiconductor substrate said first and second active devices being of first and second respective types, said method comprising depositing a gate insulator layer, depositing a layer of a first gate electrode material on said semiconductor substrate over said gate insulator layer, depositing a layer of a second gate electrode material over said layer of said first gate electrode material, wherein one of said layers of gate electrode material is of a lesser thickness in the first active device relative to that in the second active device, said method further comprising processing said layers of said first and second gate electrode material so as to cause said first and second gate electrode materials to become alloyed over substantially the entire thickness of the respective layers thereof only in said first active device.

Thus, because the thickness of one of the layers of gate material is intentionally made thicker in one region relative to that in the other region of the semiconductor substrate, when the structure is subjected to a thermal process at an elevated temperature to effect the alloying of the two gate electrode materials, the alloy only reaches the gate insulator layer on the substrate in the first region having the thinner portion of the layer of gate electrode materials, whereas in the second region having the thicker portion of the layer of gate electrode materials, a layer of the first material remains closest to the gate insulator layer after the alloying process. As a result the work function of the gate electrode layer in the first region is determined by the two materials in their alloyed form, whereas the work function in the second region is determined by the remaining layer of the first gate electrode material, just as in the process described in U.S. Pat. No. 6,518,154, without the need for the masking segment.

In a preferred embodiment, the layer of the first gate electrode material is of a lesser thickness in the first active device than in the second active device. The layer of the second gate electrode material is then deposited uniformly over the layer of said first gate electrode material.

Beneficially, said first gate electrode material comprises a metal selected from Mo, W, Ti, Pt or Al. Said second gate electrode material may also be selected from elements in Groups IIA-VIA, IB, IIIB-VIIIB of the Periodic Table or Lanthanide series elements, or Silicon. The step of processing comprises a thermal treatment at an elevated temperature in an inert atmosphere. The alloyed portion of the two layers in the second active region is preferably removed, prior to patterning of the respective gate electrodes.

The present invention extends to an integrated circuit including a CMOS semiconductor device fabricated in accordance with the above-mentioned method, wherein the first active device comprises a PMOS transistor and the second active device comprises an NMOS transistor.

The very general method of the present invention can relatively easily be applied for the co-integration of, for example, N+ doped poly-silicon gates for NMOS with B-enriched NiSi-gates for PMOS devices for a low power technological platform, as will be described in more detail later.

These and other aspects of the present invention will be apparent from, and elucidated with reference to, the embodiments described herein.

BRIEF DESCRIPTION OF THE DRAWINGS

Embodiments of the present invention will now be described by way of examples only and with reference to the accompanying drawings, in which.

DETAILED DESCRIPTION OF THE INVENTION

Firstly, a general process scheme according to an exemplary embodiment of the present invention for forming silicon-based MOS transistors of different channel conductivity type (i.e. NMOS and PMOS transistors) in or on a common semiconductor substrate 100 as in CMOS devices, will now be described in more detail with reference to FIGS. 1A-1E of the drawings.

Figure 1A:
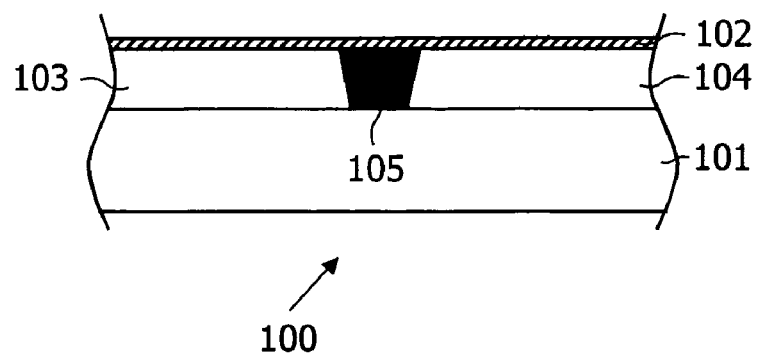
FIGS. 1A-1E are schematic cross-sectional views of a semiconductor device structure illustrating the various process steps of a general method according to an exemplary embodiment of the present invention for fabricating a CMOS device.

Referring to FIG. 1A of the drawings, a preliminary structure 100 is provided which comprises at least one isolation means 105, such as a shallow trench isolation STI formed in a semiconductor substrate 101, typically of mono-crystalline silicon, to electrically separate p-type well regions 103 and n-type well regions 104 (referred to hereinafter as transistor precursor regions) formed therein, for example, by conventional dopant diffusion or implantation. The preliminary structure 100 further includes a thin gate insulator layer 102, typically a silicon Si oxide layer, formed in contact with the upper surface of the substrate 101, as by thermal oxidation.

Figure 1B:
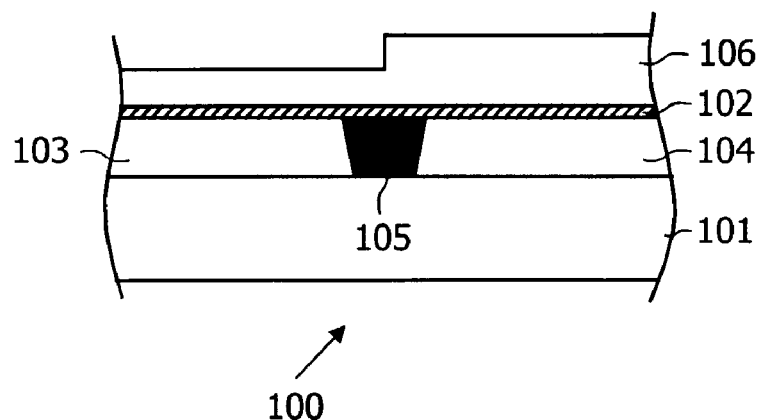

Referring to FIG. 1B of the drawings, a layer 106 of a first material A, defined by its work function $\phi_A$, is deposited directly on the gate insulator layer 102 so as to present a varying thickness, with an intentionally greater thickness in the region to be used in the fabrication of the gate electrode of one active device (e.g. NMOS device) than in the region to be used in the fabrication of the gate electrode of the complementary active device (e.g. PMOS device). The first material preferably comprises a metal, such as Mo, W, Ti, Pt or Al which may be deposited over the gate insulator layer 102 using any suitable low energy deposition process, such as chemical vapor deposition (CVD), which does not materially damage the thin gate insulator layer 102.

Figure 1C:
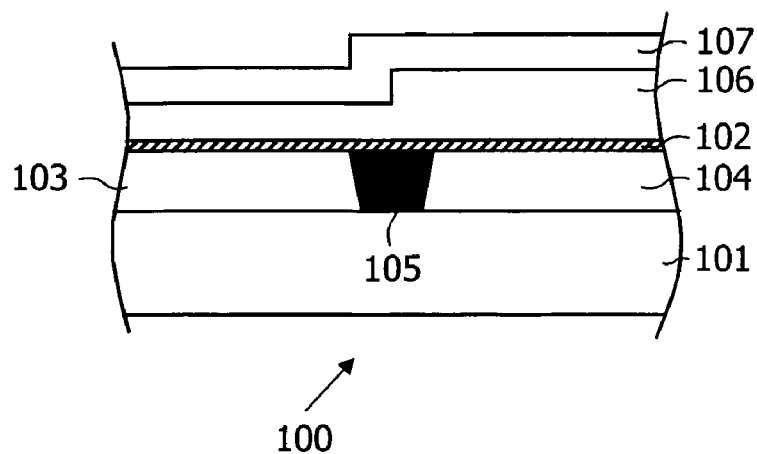

Next, referring to FIG. 1C of the drawings, a layer 107 of a second material B is uniformly deposited over the layer 106 of the first material. The second material may comprise a metal or semi-metal, selected from, for example, elements in Groups IIA-VIA, IB, IIIB-VIIIB of the Periodic Table and Lanthanide series elements, or Silicon, and may be deposited by any suitable deposition technique, including CVD, LPCVD, PVD, etc.

Figure 1D:
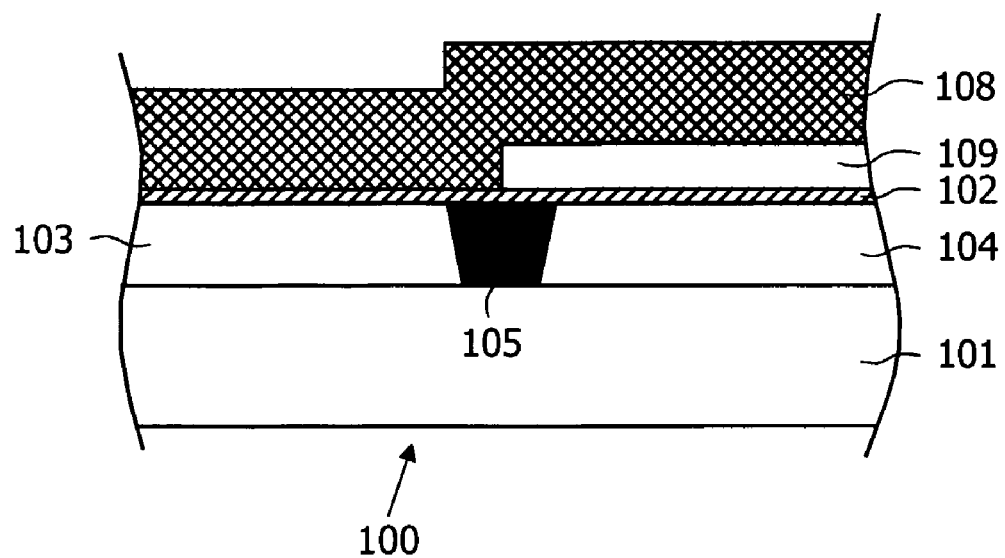

Next, referring to FIG. 1D of the drawings, a chemical reaction is effected between the first and second materials so as to form a layer 108 of the alloy AxBy. This chemical reaction is typically effected by means of a thermal treatment at an elevated temperature in an inert atmosphere for effecting an alloying (or silicidation) reaction between the first and second materials. The thickness variation of the layer 106 of the first material A is calculated (depending on the materials A and B used and the treatment used to effect the desired chemical reaction therebetween) in order to cause the alloying of the total thickness of both layers 106, 107 of material only in the region of the complementary active device, so as to result in a work function $\phi_{AxBy}$ of the future gate electrode. In the region of the active device where the first material A presents a greater thickness, the alloy is formed only in an upper portion of the layer 106 of the first material A, leaving a portion 109 of the original material A adjacent the gate insulator layer 102, and the original work function $\phi A$ is retained for the respective future gate electrode.

Figure 1E:
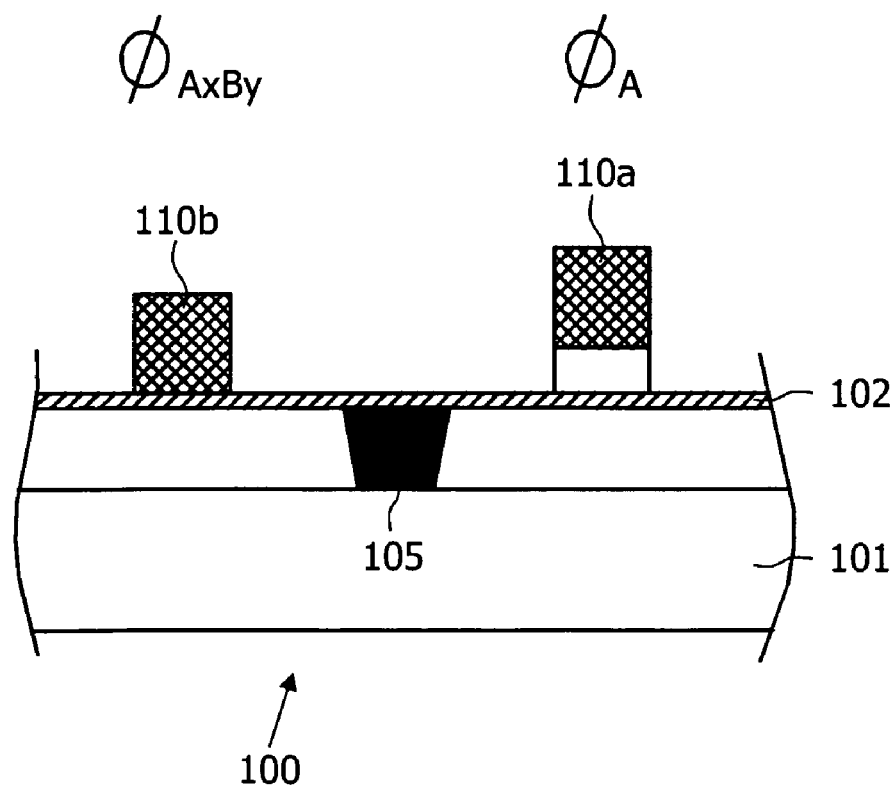

Referring to FIG. 1E of the drawings, the resultant gate electrode layers are then patterned to form respective gates 110a, 110b for a MOS transistor and an adjacent complementary MOS transistor, as shown. Beneficially, the alloyed portion of the two layers in the region of the active device where the first material A presents a greater thickness is removed, prior to patterning of the respective gate electrodes.

Thus, the method described above enables the fabrication of dual gate electrodes for CMOS applications.

In a specific exemplary application of the method of the present invention, an exemplary method for the co-integration of FUSI pre-implanted NiSi (for PMOS devices) with N+ poly-silicon gates (for NMOS devices) for low power applications will now be described with reference to FIGS. 2A-2F.

For the avoidance of doubt, the term "FUSI" stands for "Fully Silicided", a term which is commonly used and distinguishes a transistor gate with full Si transformation into Silicide (as with NiSi, for example) from a conventional one where only the top of the gate is silicided. The term "co-integration" referred to above concerns a thinkable technology platform for CMOS devices and the direct application of an exemplary embodiment of the invention in the case where a conventionally-used P+ poly-silicon gate is replaced with a more advanced metallic FUSI NiSi gate according to the described method so as to enable higher drive current, etc. As an example, consider the case of co-integration of an Ni-FUlly SIlicided (Ni-FUSI) gate presenting a segregation of Boron at the gate oxide interface, which has been implanted prior to silicidation forming thus a p-type gate for PMOS devices with N+ poly-silicon gates for NMOS devices. More information on the principle of FUSI gates can be found, for example, in Kedzierski et al, "Threshold voltage control in NiSi-gated MOSFETS through silicidation induced impurity segregation (SIIS)", IEDM 2003 and Cabral et al, "Dual Work-function Fully Silicided Metal Gates", VLSI 2004.

Figure 2A:
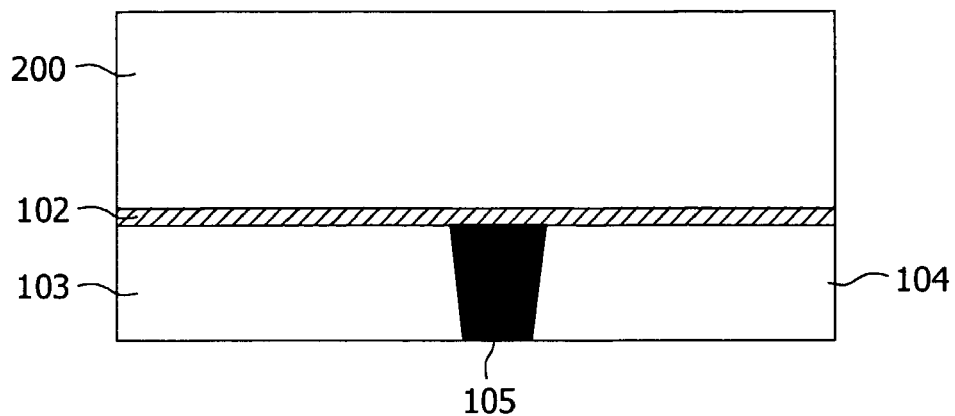
FIGS. 2A-2F are schematic cross-sectional views of a semiconductor device structure illustrating the various process steps of a specific method according to an exemplary embodiment of the present invention for effecting the co-integration of FUSI B pre-implanted NiSi (for PMOS devices) with N+ poly-silicon gates (for NMOS devices), for use in low power applications.

Thus, referring to FIG. 2A of the drawings, in the first instance, a relatively thick layer 200 of poly-silicon is deposited substantially uniformly on a thin layer 102 of gate oxide having a high dielectric constant (i.e. high-K). Once again, the gate oxide layer 102 is provided on the upper surface of a semiconductor substrate in which is formed a pair of transistor precursor regions 103, 104, electrically separated by the shallow trench isolation STI region 105.

Figure 2B:
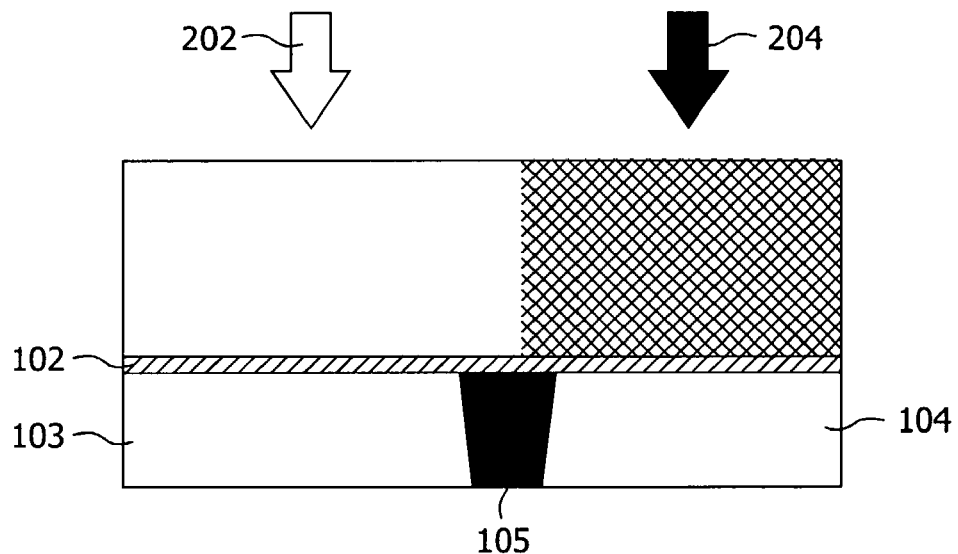
Figure 2C:
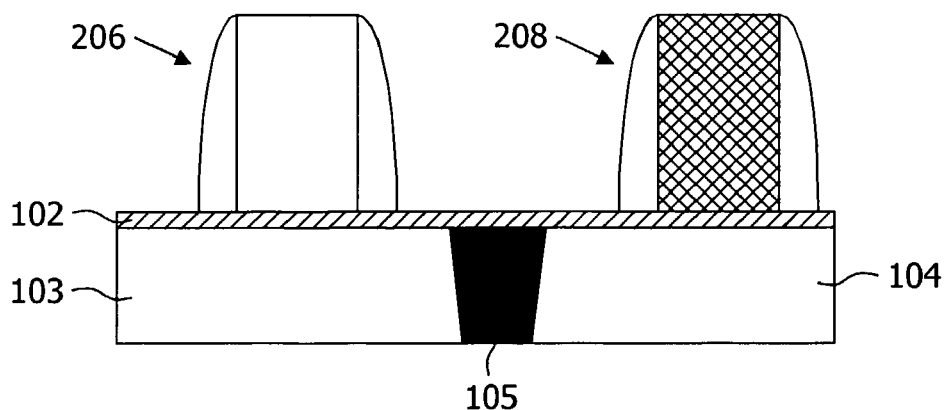

Next, and similar to a standard CMOS transistor process flow, the gate electrode regions are implanted with N+ (Phosphorous P) 202 and P+ (Boron B) 204 respectively, as illustrated schematically in FIG. 2B of the drawings, following which a conventional gate and spacer etching process is performed to create the two gate electrode structures 206, 208 illustrated in FIG. 2C of the drawings.

Figure 2D:
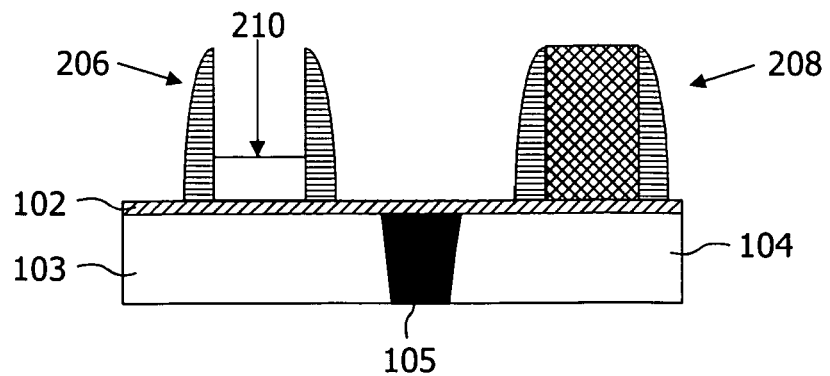

Referring to FIG. 2D of the drawings, the P+ implanted poly-silicon 210 is partially removed in respect of the first gate electrode structure 206, by means of a dopant sensitive etching process or, as an alternative, an additional lithography step, as will be apparent to a person skilled in the art.

Figure 2E:
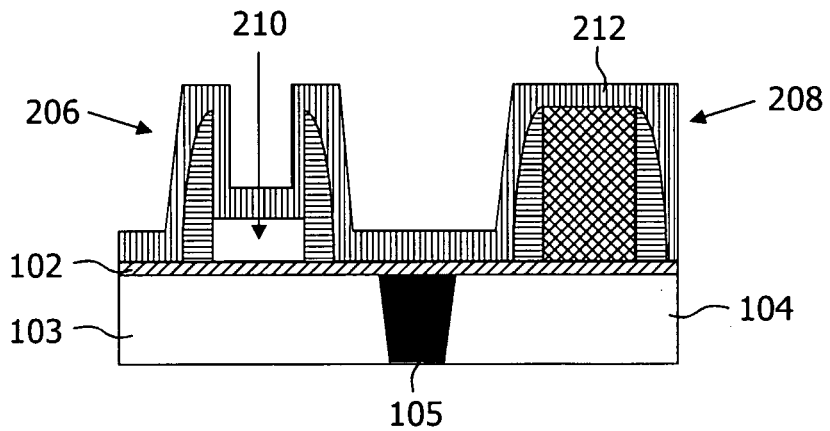

Next, and referring to FIG. 2E of the drawings, a substantially uniform layer 212 of Nickel Ni is deposited over the gate electrode structures 206, 208 and the gate oxide layer 102 therebetween, and the overall device is subjected to a thermal treatment at an elevated temperature in an inert atmosphere, as a result of which, the Ni will react with the poly-silicon of both structures 206, 208 to form NiSi (i.e. silicidation will occur).

Figure 2F:
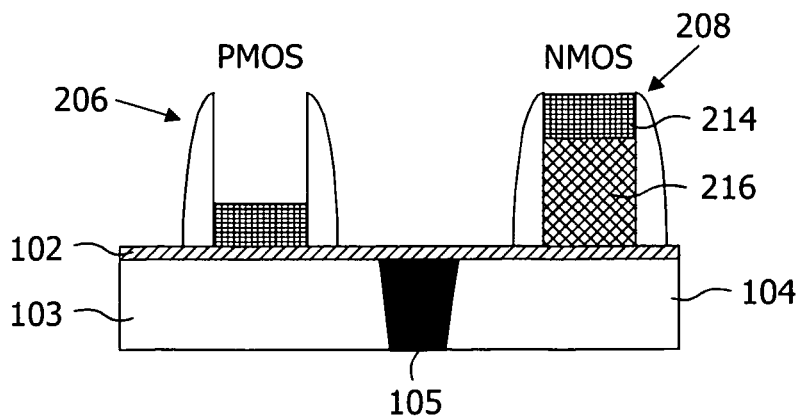

However, referring to FIG. 2F of the drawings, the depth of silicidation will depend on the poly-silicon thickness: in the NMOS structure 208, only the top 214 of the gate is transformed into NiSi, keeping the work function of the future gate electrode the same as the initial work function of the remaining poly-silicon 216, i.e. φN+Si. On PMOS areas (structure 206), however, the entire Si layer 210 is transformed into NiSi, giving rise to a p-like work function of the future gate electrode, namely $\phi_{NiSi(B)}$, due to the Boron segregation at the gate oxide interface during the full silicidation process. As shown in FIG. 2F, after the chemical reaction has been effected, the remaining unreacted Ni is removed, by means of a standard selective cleaning technique, and the remaining gate patterning steps may be the same as those of a conventional CMOS transistor flow process.

The co-integration of B-enriched Ni-FUSI gates for PMOS and N+ doped poly-silicon gate for NMOS proposed in accordance with an exemplary embodiment of the present invention is considered to be a very pragmatic way of improving on the current technology using P+ and N+ doped gates, especially for high-K gate oxides. This is because P+ doped poly-silicon on high-K oxides are affected by considerable work function shifts, so-called Fermi level pinning, and present a higher poly-depletion which is an undesirable effect linked to the semiconductor nature of the gate decreasing the capacitance, than N+ doped gates. A Ni-FUSI gate could remove these problems. Furthermore, B-enriched NiSi gates give a very good, p-like work function.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of fabricating a semiconductor device comprising first and second active devices provided in first and second respective regions of a semiconductor substrate said first and second active devices being of first and second respective types, the method comprising:
   depositing a gate insulator layer on said semiconductor substrate;
   depositing a layer of a first gate electrode material on said semiconductor substrate over said gate insulator layer;
   depositing a layer of a second gate electrode material over said layer of said first gate electrode material wherein one of said layers of gate electrode material is of a lesser thickness in the first active device relative to that in the second active device; and
   processing said layers of said first and second gate electrode materials so as to cause said first and second gate electrode materials to become alloyed together over substantially the entire thickness of the respective layers thereof only in said first active device.

2. A method according to claim 1, wherein the layer of the first gate electrode material is of a lesser thickness in the first active device than in the second active device.

3. A method according to claim 2, wherein the layer of the second gate electrode material is deposited uniformly over the layer of said first gate electrode material.

4. A method according to claim 1, wherein said first gate electrode material comprises a metal selected from Mo, W, Ti, Pt or Al.

5. A method according to claim 1, wherein said second gate electrode material is selected from elements in Groups IIA-VIA, IB, IIIB-VIIIB of the Periodic Table or Lanthanide series elements, or Silicon.

6. A method according to claim 1, wherein the step of processing comprises a thermal treatment at an elevated temperature in an inert atmosphere.

7. A method according to claim 1, wherein the alloyed portion of the two layers in second active region is removed, prior to patterning of the respective gate electrodes.

8. A method according to claim 1, wherein the first active device comprises a PMOS transistor and the second active device comprises an NMOS transistor.

9. A CMOS semiconductor device fabricated in accordance with the method of claim 1.

10. A method according to claim 1, wherein the processing of said layers of said first and second gate electrode materials comprises effecting a chemical reaction between the first and second gate electrode materials to form the alloyed portion of the two layers.

* * * * *